(12) United States Patent
Qian et al.

(10) Patent No.: US 10,586,595 B2
(45) Date of Patent: Mar. 10, 2020

(54) METHOD AND APPARATUS FOR REDUCING COUPLING BETWEEN WORD LINES AND CONTROL GATE LINES IN A FLASH MEMORY SYSTEM

(71) Applicant: Silicon Storage Technology, Inc., San Jose, CA (US)

(72) Inventors: Xiaozhou Qian, Shanghai (CN); Kai Man Yue, Shanghai (CN); Guang Yan Luo, Shanghai (CN)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 16/118,272

(22) Filed: Aug. 30, 2018

(65) Prior Publication Data

US 2019/0385679 A1    Dec. 19, 2019

(30) Foreign Application Priority Data

Jun. 15, 2018 (CN) .......................... 2018 1 0626274

(51) Int. Cl.
*G11C 16/04* (2006.01)
*G11C 16/26* (2006.01)

(52) U.S. Cl.
CPC ...... *G11C 16/0425* (2013.01); *G11C 16/0433* (2013.01); *G11C 16/26* (2013.01)

(58) Field of Classification Search
CPC .................... G11C 16/0425; G11C 16/0433
See application file for complete search history.

(56) References Cited

U.S. PATENT DOCUMENTS

| | | | |
|---|---|---|---|
| 5,023,580 A | 6/1991 | Gill et al. | |
| 6,747,310 B2* | 6/2004 | Fan .................... | H01L 27/11521 257/316 |
| 2006/0028870 A1* | 2/2006 | Roohparvar ....... | G11C 16/0483 365/185.17 |
| 2006/0176736 A1 | 8/2006 | Harari | |
| 2008/0089130 A1* | 4/2008 | Park ......................... | G11C 8/08 365/185.18 |
| 2008/0158949 A1* | 7/2008 | Mui ...................... | G11C 7/1006 365/185.03 |
| 2008/0158973 A1* | 7/2008 | Mui ...................... | G11C 7/1006 365/185.18 |
| 2008/0266951 A1* | 10/2008 | Hwang .............. | G11C 16/3418 365/185.05 |
| 2009/0073763 A1* | 3/2009 | Hosono ............... | G11C 11/5642 365/185.03 |
| 2009/0238003 A1* | 9/2009 | Namiki .............. | G11C 16/0483 365/185.17 |
| 2012/0213003 A1 | 8/2012 | Yun et al. | |
| 2014/0211570 A1 | 7/2014 | Chen et al. | |
| 2015/0071008 A1* | 3/2015 | Yang ..................... | G11C 16/26 365/185.23 |

* cited by examiner

*Primary Examiner* — Hoai V Ho
*Assistant Examiner* — Jay W. Radke
(74) *Attorney, Agent, or Firm* — DLA Piper LLP (US)

(57) ABSTRACT

A method and apparatus are disclosed for reducing the coupling that otherwise can arise between word lines and control gate lines in a flash memory system due to parasitic capacitance and parasitic resistance. The flash memory system comprises an array of flash memory cells organized into rows and columns, where each row is coupled to a word line and a control gate line.

10 Claims, 6 Drawing Sheets

FIGURE 4

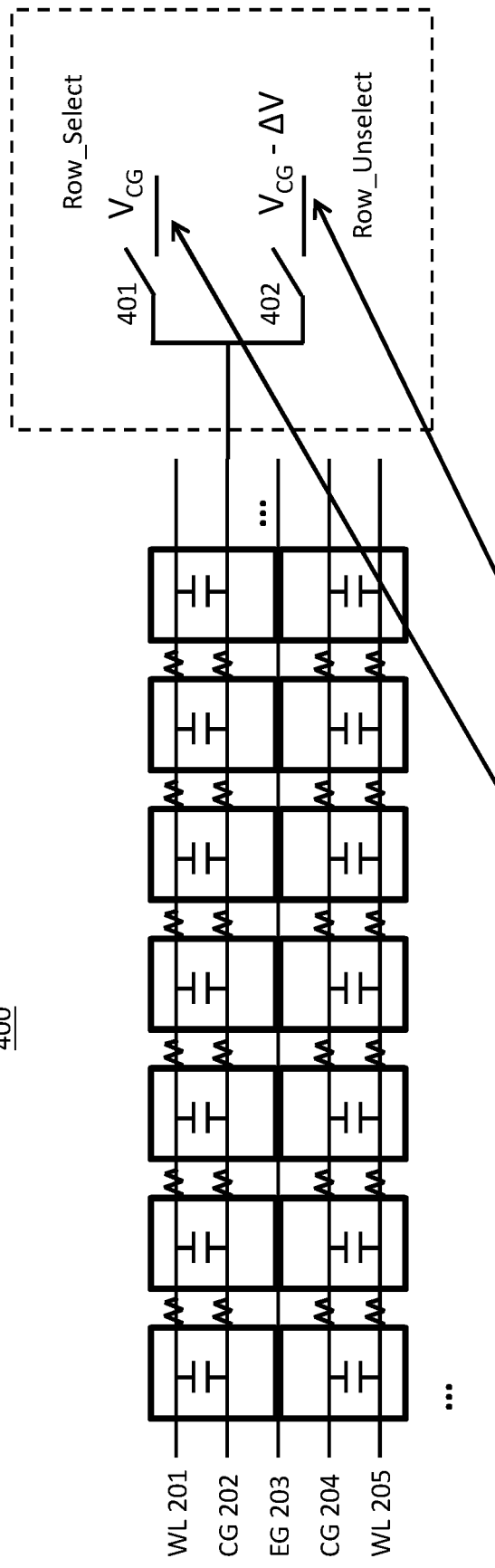

CG 202 will bias to $V_{CG}$ for selected row
CG 202 will bias to $V_{CG} - \Delta V$ for unselected row

- All CG is connected to $V_{CG} - \Delta V$ via switch 402
- When WL goes high at the beginning of a read cycle:
  - CG is coupled up from $V_{CG} - \Delta V$ to $V_{CG}$ and maintained at $V_{CG}$
- When WL goes low at the end of the read cycle:
  - CG is coupled down from $V_{CG}$ to $V_{CG} - \Delta V$ and maintained at $V_{CG} - \Delta V$

METHOD AND APPARATUS FOR REDUCING COUPLING BETWEEN WORD LINES AND CONTROL GATE LINES IN A FLASH MEMORY SYSTEM

PRIORITY CLAIM

This application claims priority under 37 CFR Section 1.55 to China Patent Application No. 201810626274.X, filed on Jun. 15, 2018, and titled "Method and Apparatus for Reducing Coupling Between Word Lines and Control Gate Lines in a Flash Memory System," which is incorporated by reference herein.

FIELD OF THE INVENTION

A method and apparatus are disclosed for reducing the coupling that otherwise can arise between word lines and control gate lines in a flash memory system due to parasitic capacitance and parasitic resistance.

BACKGROUND OF THE INVENTION

Digital non-volatile memories are well known. For example, FIG. 1 depicts four-gate split-gate flash memory cell 100 comprising source region 101, drain region 102 (coupled to bit line 24), floating gate 103 over a first portion of channel region 104, word line terminal 105 (typically coupled to a word line) over a second portion of channel region 104, substrate 108, control gate 106 (typically coupled to a control gate line) over floating gate 103, and erase gate 107 (typically coupled to an erase gate line) over the source region 101. This configuration is described in U.S. Pat. No. 6,747,310, which is incorporated herein by reference for all purposes). Here, all gates are non-floating gates except floating gate 103, meaning that they are electrically connected or connectable to a voltage source. Programming of memory cell 100 occurs by causing heated electrons to be injected from channel region 104 into floating gate 103. Erasing of memory cell 100 occurs by causing electrons to tunnel from floating gate 103 to erase gate 107.

Table No. 1 depicts typical voltage ranges that can be applied to the terminals of memory cell 100 for performing read, erase, and program operations:

TABLE NO. 1

| Operation of Flash Memory Cell 100 of FIG. 1 | | | | |
| --- | --- | --- | --- | --- |
| WL | BL | CG | EG | SL |
| Read 1.0-2 V | 0.6-2 V | 0-2.6 V | 0-2.6 V | 0 V |
| Erase −0.5 V/0 V | 0 V | 0 V/−8 V | 8-12 V | 0 V |
| Program 1 V | 1 µA | 8-11 V | 4.5-9 V | 4.5-5 V |

FIG. 2A shows prior art flash memory system 200, which comprises an array of cells 100 arranged in rows and columns. Here, only two rows and seven columns are shown, but it is to be understood that the array can comprise any number of rows and any number of columns. Cells 100 in this example are of the type shown in FIG. 1, wherein the erase gate is shared or merged among two adjacent rows.

In the top row of cells shown in FIG. 2A, word line 201 connects to each word line terminal 105 of each cell 100 in that row, control gate line 202 connects to each control gate terminal 106 of each cell 100 in that row, and erase gate line 203 connects to each shared erase gate terminal 107 of each cell 100 in that row.

In the second row of cells shown in FIG. 2A, word line 205 connects to each word line terminal 105 of each cell 100 in that row, control gate line 204 connects to each control gate terminal 106 of each cell 100 in that row, and erase gate line 203 connects to each shared erase gate terminal 107 of each cell 100 in that row. Notably, erase gate line 203 connects to erase gate terminal 107 of each cell 100 shared among the top row and the second row.

With reference to FIG. 2B, the close proximity of word lines, control gate lines, and floating gates create parasitic effects. Specifically, parasitic capacitance will exist between adjacent word lines and control gate lines, such as between word line 201 and control gate line 202 and between word line 205 and control gate line 204, and parasitic capacitance also will exist between word line 201 and the floating gates in each cell 100 in the top row and between word line 205 and the floating gates in each cell 100 in the second row.

The parasitic capacitance can be modeled with: (1) parasitic capacitor 210 located within each cell 100, with one terminal connected to a word line and one terminal connected to a control gate line, and (2) parasitic capacitor 220 located within each cell 100, with one terminal connected to a word line and one terminal connected to floating gate 103 within the cell.

The effect of parasitic capacitors 210 is that there is voltage coupling between adjacent word lines and control gate lines that responds to changes in voltage on the word lines and/or control gate lines. The effect of parasitic capacitors 220 is that there is voltage coupling between word lines and floating gates within each cell 100 that responds to changes in voltage on the word lines and/or floating gates.

Parasitic capacitors 210 and 220 will cause word lines and control gate lines to take longer to charge to a certain voltage and longer to discharge. This parasitic capacitance has the unwanted effect of varying the current through each cell 100 during a discharge, which can cause read errors. As a result, the margin of error for read sensing operations is reduced. The problem is exacerbated as the target switching speed of the word line and control gate lines increases.

In addition, each word line and control gate line will have a large parasitic resistance. This resistance is due to the relative small size of the devices and the line width. The parasitic resistance can be modeled with parasitic resistors 230 located between cells 100 in each row.

FIG. 3 provides an example of the negative effect of this parasitic capacitance and parasitic resistance. In this example, word line 201 is selected for a read operation and is driven high. The voltage on control gate line 202 increases to $V_{CG}+\Delta V$ from $V_{CG}$ due to coupling with word line 201, and then discharges down to $V_{CG}$. After word line 201 discharges, control gate 202 discharges to $V_{CG}-\Delta V$ and then charges back to $V_{CG}$.

The additional $\Delta V$ on control gate line 202 causes an increase of cell current during the read operation. If the read operation does not provide sufficient time for control gate line 202 to discharge from $V_{CG}+\Delta V$ to $V_{CG}$, then a selected cell that is storing a "0" may be misinterpreted as containing a "1." To avoid this problem, the switching speed must allow for a discharge period on the order of 10's of nanoseconds. Thus, parasitic capacitance and parasitic resistance will result in a less accurate system.

What is needed is a flash memory system that reduces the parasitic capacitance between word lines and control gate lines and between word lines and floating gates in a flash memory system.

SUMMARY OF THE INVENTION

A method and apparatus are disclosed for reducing the coupling that otherwise can arise between word lines and control gate lines in a flash memory system due to parasitic capacitance and parasitic resistance.

BRIEF DESCRIPTION OF THE DRAWINGS

FIG. 4 depicts an embodiment of a decoupling circuit.

DETAILED DESCRIPTION OF THE INVENTION

Figure 1:
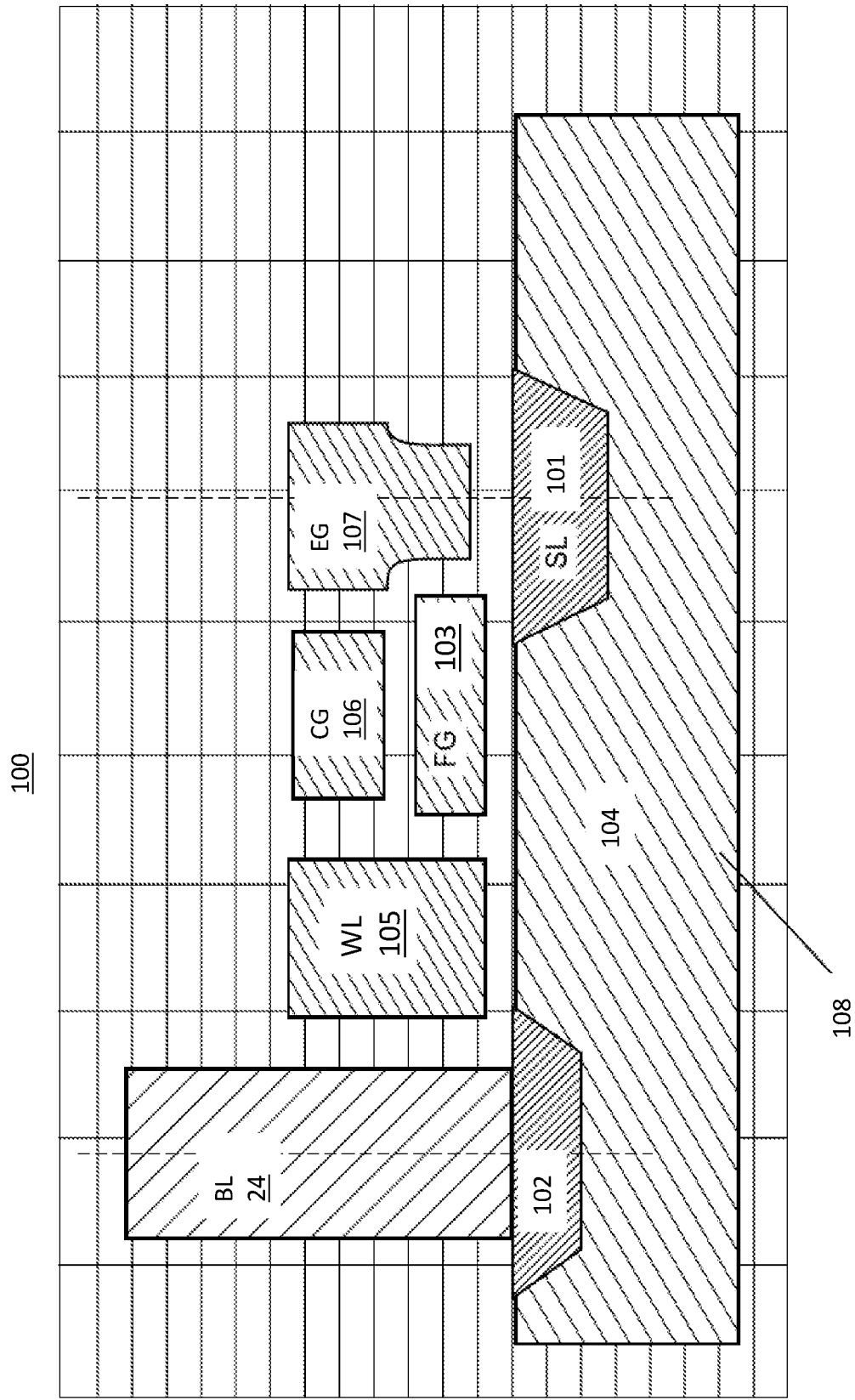
FIG. 1 depicts a cross-section of a prior art flash memory cell.
Figure 2A:
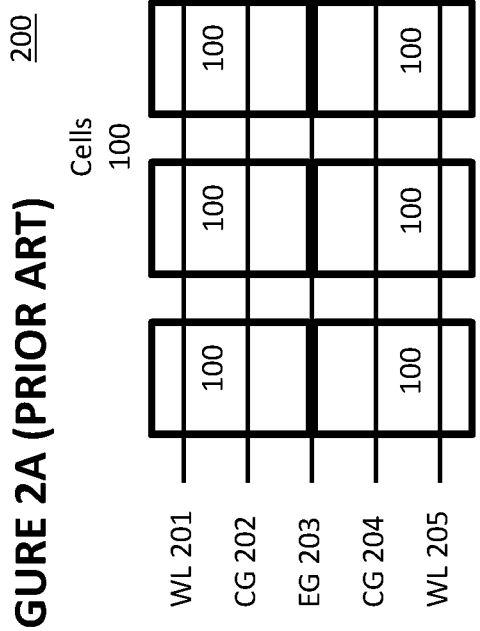
FIG. 2A depicts a portion of an array of prior art flash memory cells.
Figure 2B:
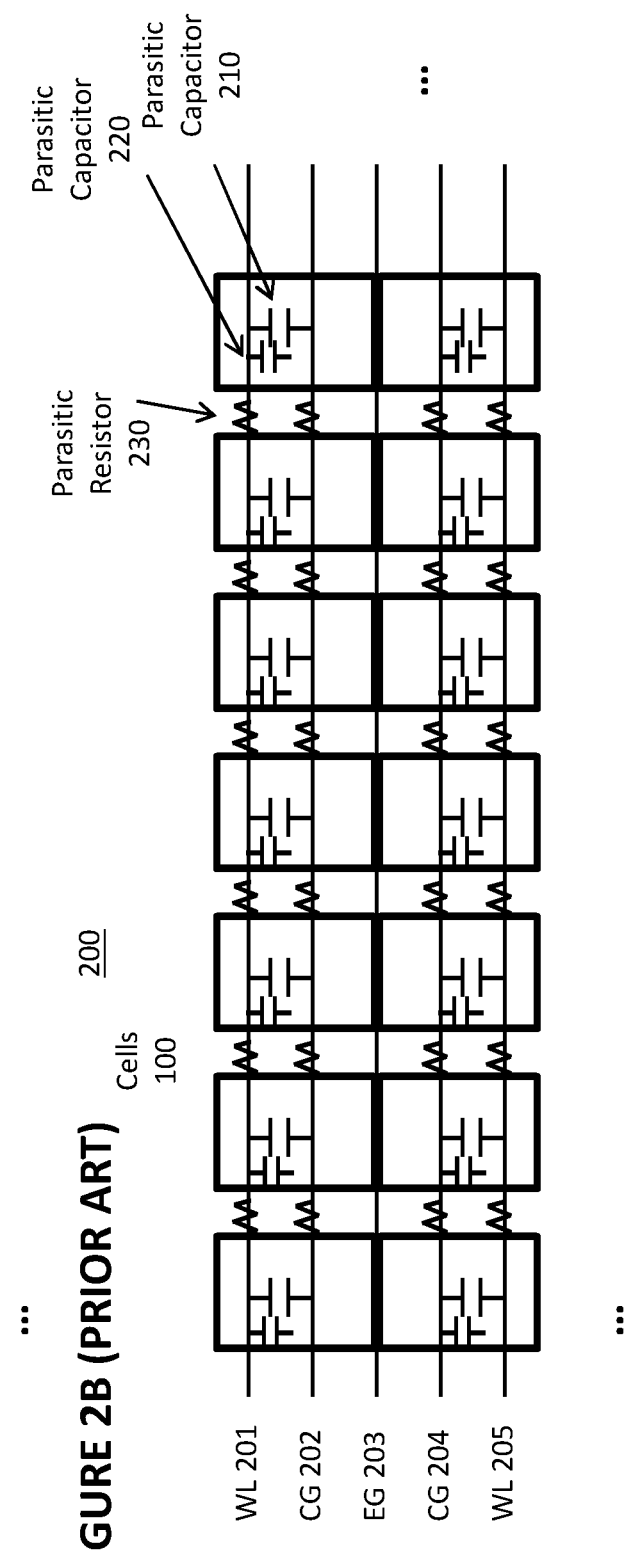
FIG. 2B depicts the parasitic capacitance and parasitic resistance in the array of prior art flash memory cells of FIG. 2A.
Figure 3:
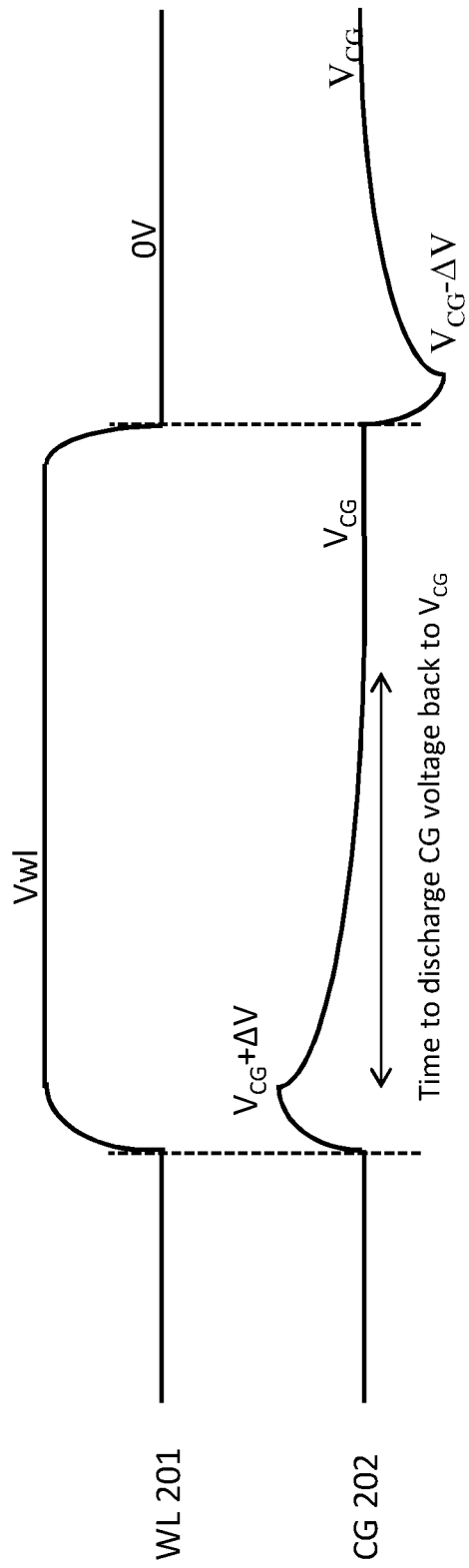
FIG. 3 depicts exemplary waveforms showing the effect of parasitic capacitance and parasitic resistance on a control gate line during a read operation.

FIG. 4 depicts flash memory system 400. Flash memory system 400 is similar to flash memory system 200, with the addition of decoupling circuit 410. Decoupling circuit 410 comprises switches 401 and 402. During a read operation, a control gate line for a selected row is coupled to a voltage $V_{CG}$ by switch 401, and a control gate line for unselected rows are coupled to a voltage $V_{CG}-\Delta V$ by switch 402.

Figure 5:
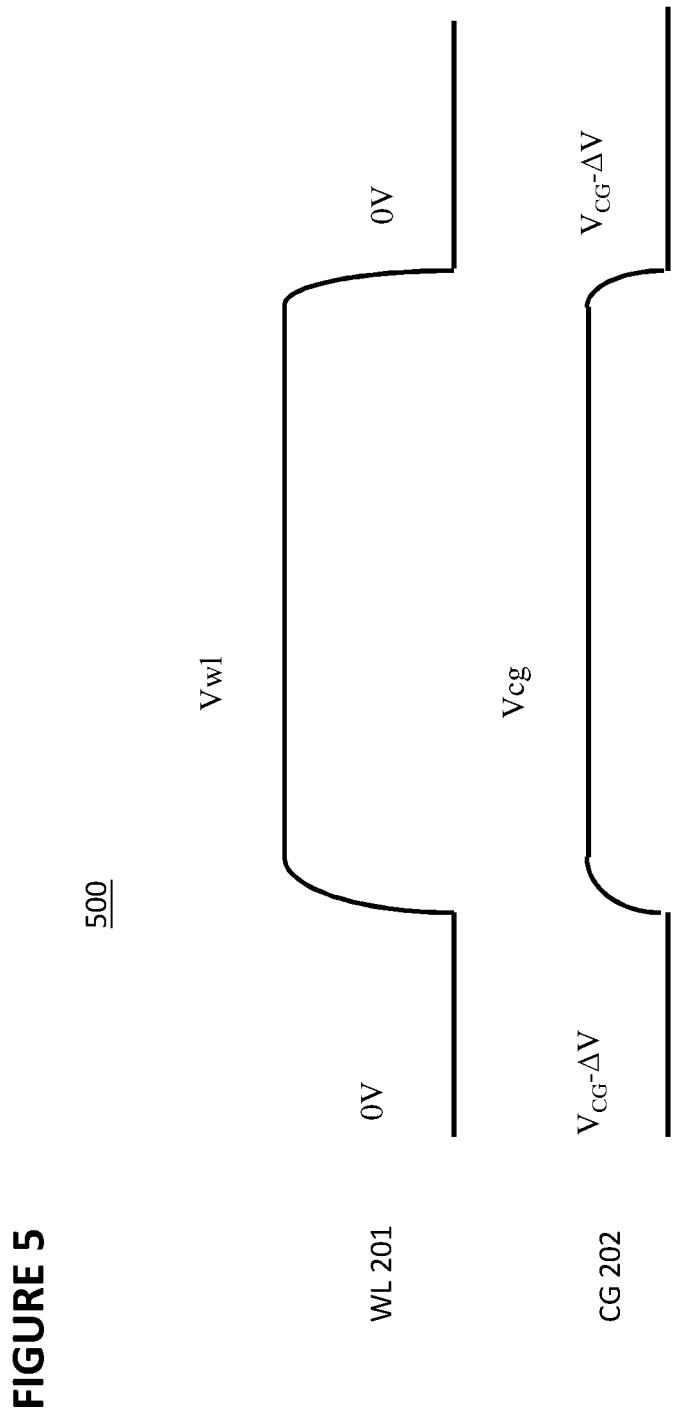
FIG. 5 depicts exemplary waveforms for the system of FIG. 4.

The effect of decoupling circuit 410 is depicted in FIG. 5. In this example, word line 201 is selected for a read operation. Switch 402 initially is closed and then is opened, and when word line 201 is driven high, control gate line 202 is driven from $V_{CG}-\Delta V$ to $V_{CG}-\Delta V+\Delta V$ (which equals $V_{CG}$), which is the desired voltage level for a control gate line of a selected row during a read operation. After word line 201 discharges, switch 402 is closed and control gate line 202 will discharge back to $V_{CG}-\Delta V$.

Figure 6:
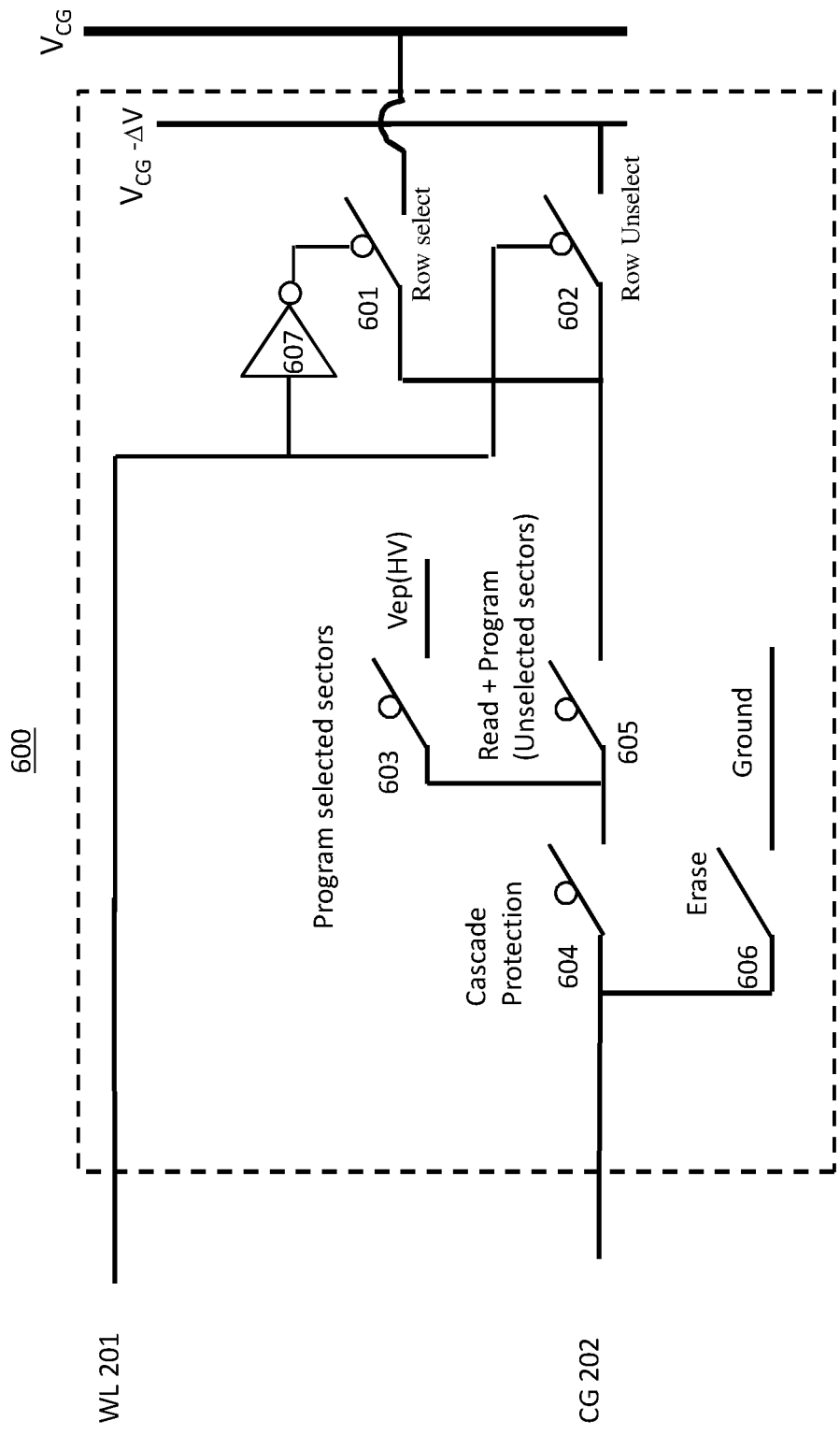
FIG. 6 depicts another embodiment of a decoupling circuit.

Another embodiment is shown in FIG. 6. Decoupling circuit 600 (which can be used instead of decoupling circuit 410) comprises switches 601, 602, 603, 604, 605, and 606 and inverter 607. During a read operation involving the row of word line 201 and control gate 202, word line 201 will be driven high. Switch 602 will remain open. The output of inverter 607 will be low, and switch 601 will close. Switches 604 and 605 also will be closed, such that the voltage $V_{CG}$ is provided to control gate line 202.

In instances where the row of word line 201 and control gate 202 is not selected, word line 201 will be low. Switch 602 will be closed. The output of inverter 607 will be high, and switch 601 will be open. Switches 604 and 605 also will be closed, such that the voltage $V_{CG}-\Delta V$ is provided to control gate line 202.

During a program operation, switches 603 and 604 will be closed, such that the voltage Vep(HV) will be provided to control gate line 202.

During an erase operation, switch 606 will be closed, such that control gate line 202 will be pulled to ground.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements there between.

What is claimed is:

1. A flash memory system comprising:
   an array of flash memory cells, wherein the flash memory cells are organized into rows and columns and each flash memory cell comprises a word line terminal, a control gate terminal, and a floating gate;
   a plurality of word lines, each of the plurality of word lines coupled to the word line terminals of the flash memory cells in a row of the array;
   a plurality of control gate lines, each of the plurality of control gate lines coupled to the control gate line terminals of the flash memory cells in a row of the array; and
   a decoupling circuit for coupling a control gate line for a selected row for a read operation to a first voltage source and for coupling control gate lines for unselected rows for the read operation to a second voltage source, wherein the second voltage source generates a voltage that is less than the voltage generated by the first voltage source by an amount $\Delta V$;
   wherein $\Delta V$ is approximately equal to the increase in voltage of the control gate line of the selected row that is generated due to parasitic capacitance between the control gate line for the selected row and the word line for the selected row when the word line for the selected row is driven high.

2. The flash memory system of claim 1, wherein the decoupling circuit comprises a first switch for selectively coupling the first voltage source to selected row of a read operation and a second switch for selectively coupling the second voltage source to one or more unselected rows of a read operation.

3. The flash memory system of claim 1, wherein the flash memory cells are split-gate flash memory cells.

4. The flash memory system of claim 2, wherein the flash memory cells are split-gate flash memory cells.

5. A method of decoupling a control gate line from an adjacent word line in a flash memory system during a read operation, the flash memory system comprising an array of flash memory cells organized in rows and columns, a plurality of word lines wherein each of the plurality of word lines is coupled to the word line terminals of the flash memory cells in a row of the array, and a plurality of control gate lines wherein each of the plurality of control gate lines is coupled to the control gate line terminals of the flash memory cells in a row of the array, each flash memory cell comprising a word line terminal, a control gate terminal, and a floating gate, the method comprising:
   coupling a control gate line for a selected row for a read operation to a first voltage source;

coupling control gate lines for unselected rows for the read operation to a second voltage source, wherein the voltage generated by the second voltage source is less than the voltage generated by the first voltage source by an amount ΔV; and coupling a word line for the selected row for the read operation to a third voltage source;

wherein, due to parasitic capacitance between the control gate line for the selected row and the word line for the selected row, the voltage of the control gate line for the selected row increases by an amount approximately equal to ΔV after the word line for the selected row is coupled to the third voltage source.

6. The method of claim 5, wherein the step of coupling a control gate line for a selected row for a read operation to a first voltage source comprises closing a switch between the control gate line for the selected row for a read operation and the first voltage source.

7. The method of claim 6, wherein the step of coupling control gate lines for unselected rows for a read operation to a second voltage source comprises closing a switch between the control gate lines for the unselected rows for a read operation and the second voltage source.

8. The method of claim 5, wherein the flash memory cells are split-gate flash memory cells.

9. The method of claim 6, wherein the flash memory cells are split-gate flash memory cells.

10. The method of claim 7, wherein the flash memory cells are split-gate flash memory cells.

* * * * *